United States Patent
Lee et al.

(10) Patent No.: US 6,323,091 B1
(45) Date of Patent: Nov. 27, 2001

(54) METHOD OF FORMING SEMICONDUCTOR MEMORY DEVICE WITH LDD

(75) Inventors: Sungkwon Lee, Boise; Timothy K. Carns, Meridian, both of ID (US)

(73) Assignee: Zilog, Inc., Campbell, CA (US)

( * ) Notice: Subject to any disclaimer, the term of this patent is extended or adjusted under 35 U.S.C. 154(b) by 0 days.

(21) Appl. No.: 09/354,884

(22) Filed: Jul. 16, 1999

(51) Int. Cl.$^7$ ................................. H01L 21/8234
(52) U.S. Cl. .................. 438/275; 438/199; 438/213; 438/231; 438/232; 438/279; 438/305; 438/306; 438/514; 438/527; 438/529
(58) Field of Search .................. 438/199, 213, 438/275, 279, 231, 232, 514, 527, 529, 305, 306

(56) References Cited

U.S. PATENT DOCUMENTS 5,407,852 * 4/1995 Ghio et al. ..................... 437/48
5,538,914    7/1996 Chiu et al. .
5,716,885    2/1998 Kim et al. .
5,776,806 * 7/1998 Dennison et al. ................. 438/199

FOREIGN PATENT DOCUMENTS 6329578   2/1988 (JP) .
289163   10/1996 (TW) .

* cited by examiner

Primary Examiner—Matthew Smith
Assistant Examiner—Craig P. Lytle
(74) Attorney, Agent, or Firm—Skjerven Morrill MacPherson LLP; Gerald P. Parsons; Christopher B. Allenby

(57) ABSTRACT

A method for manufacturing a semiconductor device in which ROM programming ion implantation is performed by utilizing the same mask as used for implanting dopant in MOS transistors. The ROM programming ion implantation is conducted under the same conditions as the MOS transistor forming step. Only a single mask needs to be modified for the programming, thus reducing cost and complexity of manufacturing the device.

16 Claims, 13 Drawing Sheets

METHOD OF FORMING SEMICONDUCTOR MEMORY DEVICE WITH LDD

FIELD OF THE INVENTION

The present invention relates generally to a method for manufacturing a semiconductor device, and particularly to a method for manufacturing a ROM (read only memory) having a high breakdown voltage and a high threshold voltage.

BACKGROUND OF THE INVENTION

ROM devices include memory cells for storing data, and peripheral circuitry to control the read operation from the memory cells. A memory cell stores a bit of data. Specifically, each memory cell composed of an N-type transistor has a threshold voltage indicating each bit of the data. For example, a high threshold voltage corresponds to a "1" bit, and a low threshold voltage corresponds to a "0" bit.

There are various methods for manufacturing ROMs. For example, U.S. Pat. No. 5,538,914 (Chiu et al.) describes a method for manufacturing a ROM device having LDD (lightly doped drain) regions. The method of Chiu et al. uses two programming masks for an NLDD (N-type lightly doped drain) implant and a PLDD (P-type lightly doped drain) implant. Since the method of Chiu et al. requires two programming masks to be modified based on the data, the method results in higher manufacturing cost and complexity.

U.S. Pat. No. 5,407,852 (Ghio et al.) also describes a manufacturing method of a ROM device. However, the method of Ghio et al. also uses two photoresist masks for ROM programming. Namely, a photoresist mask M1 in FIG. 2 of Ghio et al., and a ROM protection photoresist mask M2 in FIG. 4 of Ghio et al. should be modified in accordance with the data to be programmed. Therefore, Ghio et al. does not improve the complexity and cost of manufacturing associated with the two mask programming.

SUMMARY OF THE INVENTION

The present invention provides a method for manufacturing a semiconductor device which requires only a single mask for ROM programming. The present invention also provides a semiconductor device in which ROM programming is performed by forming a PLDD region between a source region and a gate region of a programmed cell.

According to one aspect of the present invention, ROM programming ion implantation is performed by the same mask as one used for implanting dopant in MOS transistors of a peripheral region. The ROM programming ion implantation is concurrently conducted with formation of the MOS transistors in the peripheral region. As a result, only a single mask needs to be modified for the ROM programming, with no masks added. Thus, the present invention reduces cost and complexity of manufacturing the device.

According to another aspect of the present invention, a programmed cell of the present invention has a PLDD region between a source region and a gate region of a memory cell, and has a NLDD region between a drain region and the gate region of the memory cell. Since the PLDD region adjacent to the source contributes to a high threshold voltage, and the NLDD region adjacent to the drain contributes to a high breakdown voltage, the device of the present invention exhibits balanced characteristics suitable for a ROM device.

According to another aspect of the present invention, a programmed cell of the present invention has PLDD regions between a source region and a gate region of a memory cell, and between a drain region and the gate region of the memory cell. Since the PLDD region adjacent to the source contributes to a high threshold voltage, the device of the present invention exhibits characteristics suitable for a ROM device. Further, the device is immune to programming mask misalignment since, in a programmed cell, an edge of the programming mask does not need to be on the gate structure.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION THE DRAWINGS

DETAILED DESCRIPTION OF THE PREFERRED EMBODIMENTS

The present invention will be described in detail with reference to the drawings, wherein like elements are referred to with like reference labels throughout.

Figure 1:
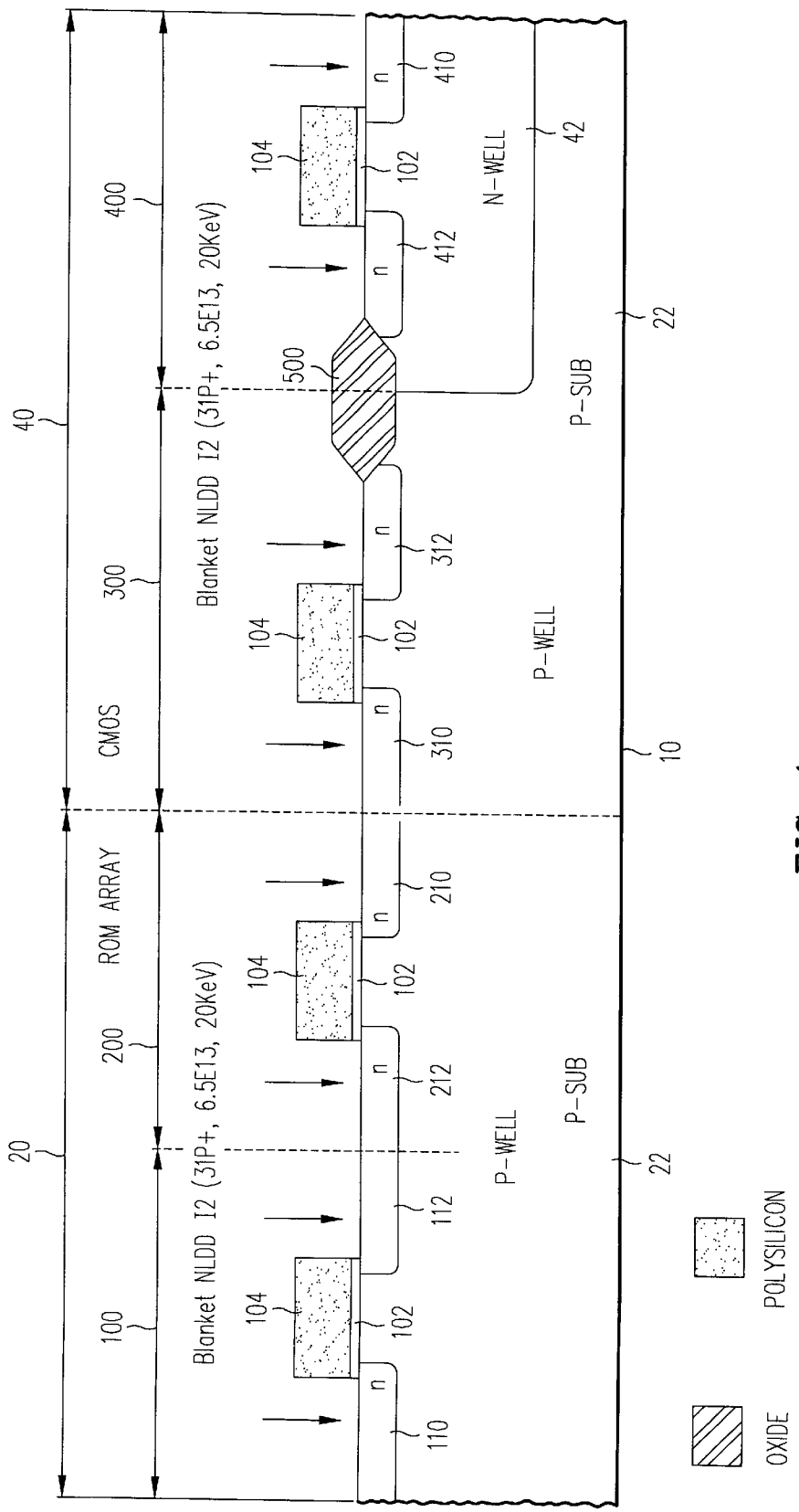
FIG. 1 illustrates a step of NLDD blanket ion implantation of the present invention.

Referring initially to FIG. 1, a single crystal substrate 10 has a <100> crystallographic orientation. The substrate 10 has a memory region 20, and a peripheral region 40. The memory region 20 is formed on a P-type silicon semiconductor substrate, or a P-well 22. The memory region 20 includes a programmed cell 100, and an unprogrammed cell 200. The programmed cell 100, and the unprogrammed cell 200 are typically NMOS (N-type metal oxide semiconductor) transistors.

In this specification, a "programmed cell" refers to a cell which is ultimately ion implanted for programming, or coding a bit of data. As will be appreciated by those skilled in the art, the programmed cell 100 in FIG. 1, which has not actually been programmed yet in FIG. 1, will be ion implanted for programming in a later ROM programming step. The unprogrammed cell 200 will not be ion implanted in the ROM programming step.

The peripheral region 40 includes an NMOS transistor 300, and a PMOS (P-type metal oxide semiconductor) transistor 400. The NMOS transistor 300 is formed on the P-well 22. The PMOS transistor 400 is formed on an N-type silicon semiconductor substrate, or an N-well 42.

The memory region 20 stores bits of input data in a non-volatile manner by setting each threshold voltage of transistors in the memory region 20 in accordance with the input data. Circuitry in the peripheral region 40 scans the programmed cell 100 and the unprogrammed cell 200 in the memory region 20, and detects an ON/OFF state (i.e., a threshold voltage) of each of the scanned cells in the memory region 20.

For example, if a scanned cell is in an OFF state due to its high threshold voltage, the peripheral region 40 outputs a H-level data signal corresponding to a "1" bit. To the contrary, if the scanned cell is in an ON state due to its low threshold voltage, the peripheral region 40 outputs a L-level data signal corresponding to a "0" bit.

A FOX (field oxide) region 500 isolates the NMOS transistor 300 and the PMOS transistor 400. The FOX region 500 is typically created via a photoresist and dry etching to define a silicon nitride-silicon dioxide composite layer. After the photoresist is removed and wet clean process is conducted, thermal oxidation in an oxygen ambient is performed using the composite layer as a hard mask to form the FOX region 500.

A thickness of the FOX region 500 ranges from about 3E-7 m to about 8E-7 m. The silicon nitride layer is then typically removed using hot phosphoric acid solution while the silicon dioxide is removed by using diluted HF or BOE (buffered oxide etch) solution. Other technology such as trench isolation may be used for isolation.

Subsequently, a gate insulation layer 102 is formed on the programmed cell 100, the unprogrammed cell 200, the NMOS transistor 300, and the PMOS transistor 400 by using an oxygen-steam ambient, at a temperature from about 800° C. to about 1100° C. Alternatively, the gate insulation layer 102 may be formed by using other known oxide chemical compositions and procedures. For example, the gate insulation layer 102 can be silicon dioxide formed by a chemical vapor deposition process, with a TEOS (tetraethylorthosilicate) source, at a temperature from about 600° C. to about 800° C., and a pressure from about 0.1 torr to about 10 torr. A thickness of the gate insulation layer 102 ranges from about 5E-9 m to about 2E-8 m.

After the gate insulation layer 102 is formed, gate structures 104 are provided on the gate insulation layer 102 in the programmed cell 100, the unprogrammed cell 200, the NMOS transistor 300, and the PMOS transistor 400. The gate structures 104 are formed from a polysilicon layer deposited by chemical vapor deposition. The polysilicon gate layer is then doped to provide high conductivity.

As illustrated in FIG. 1, blanket ion implantation with N-type conductive dopant is performed on the memory region 20 and the peripheral region 40 by using the gate structures 104 as a mask, thereby forming NLDD (N-type lightly doped drain) regions 110, 112, 210, 212, 310, 312, 410, and 412 adjacent to the gate structures 104. The NLDD regions 110, 210, 310, and 410 are located on a source side of the programmed cell 100, the unprogrammed cell 200, the NMOS transistor 300, and the PMOS transistor 400, respectively. The NLDD regions 112, 212, 312, and 412 are located on a drain side of the programmed cell 100, the unprogrammed cell 200, the NMOS transistor 300, and the PMOS transistor 400, respectively. In normal transistor operation, the source and the substrate are supplied with the same electrical potential, while the gate and the drain are biased to turn the transistor on or off.

The dopant of the blanket NLDD ion implantation is phosphorus or arsenic, and the implantation is performed with relatively low dosage. The energy, and the dosage of the blanket NLDD ion implantation are preferably from about 10 keV to about 100 keV, and from about 1E12 atoms/cm$^2$ to about 2E14 atoms/cm$^2$, respectively. More preferably, the energy, and the dosage of the blanket NLDD ion implantation using phosphorus (atomic weight: 30.97) as dopant is about 20 keV, and about 6.5E13 atoms/cm$^2$, respectively.

Figure 2:
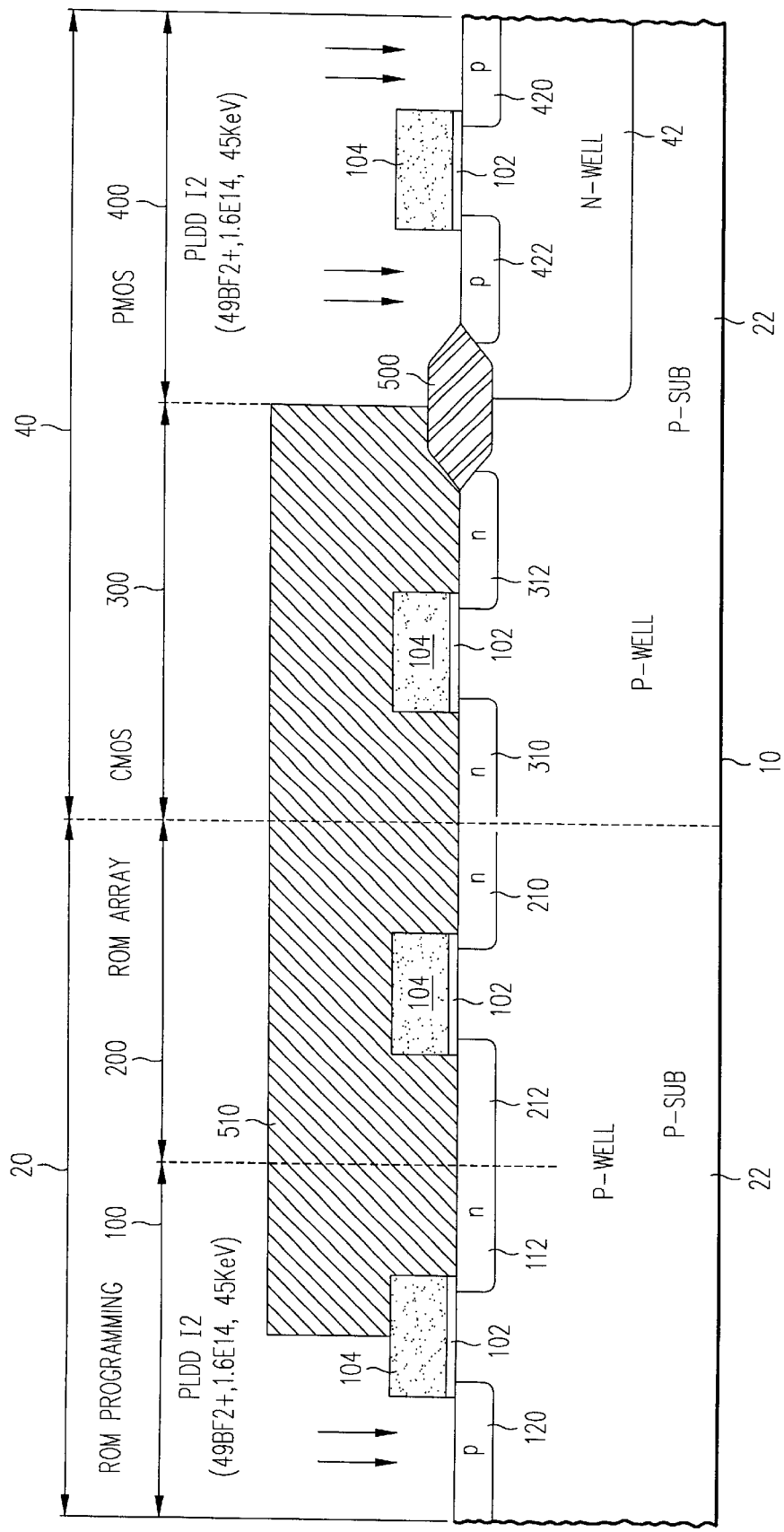
FIG. 2 illustrates a step of PLDD ROM programming ion implantation of the first embodiment of the present invention.

Now referring to FIG. 2, a photoresist 510 is patterned to cover the NLDD regions 112, 210, 212, 310, and 312, and to expose the NLDD regions 110, 410, and 412 in FIG. 1. The photoresist 510 is formed by a conventional lithography process.

Next, ROM programming ion implantation with P-type conductive dopant is performed on the programmed cell 100 and the PMOS transistor 400 by using the photoresist 510 as a mask, thereby forming PLDD (P-type lightly doped drain) regions 120, 420, and 422 adjacent to the gate structures 104. The PLDD regions 120, and 420 are located on a source side of the programmed cell 100, and the PMOS transistor 400, respectively. The PLDD region 422 is located on a drain side of the PMOS transistor 400.

The dopant of the ROM programming PLDD ion implantation is $BF_2$ or boron, and the implantation is performed with low dosage, but higher than the dosage of the blanket ion implantation for forming the NLDD regions. The energy, and the dosage of the ROM programming PLDD ion implantation are preferably from about 10 keV to about 120 keV, and from about 5E12 atoms/cm$^2$ to about 5E14 atoms/cm$^2$, respectively. More preferably, the energy, and the dosage of the ROM programming PLDD ion implantation using $BF_2$ (molecular weight: 48.81) as dopant is about 45 keV, and about 1.6E14 atoms/cm$^2$, respectively.

Figure 3:
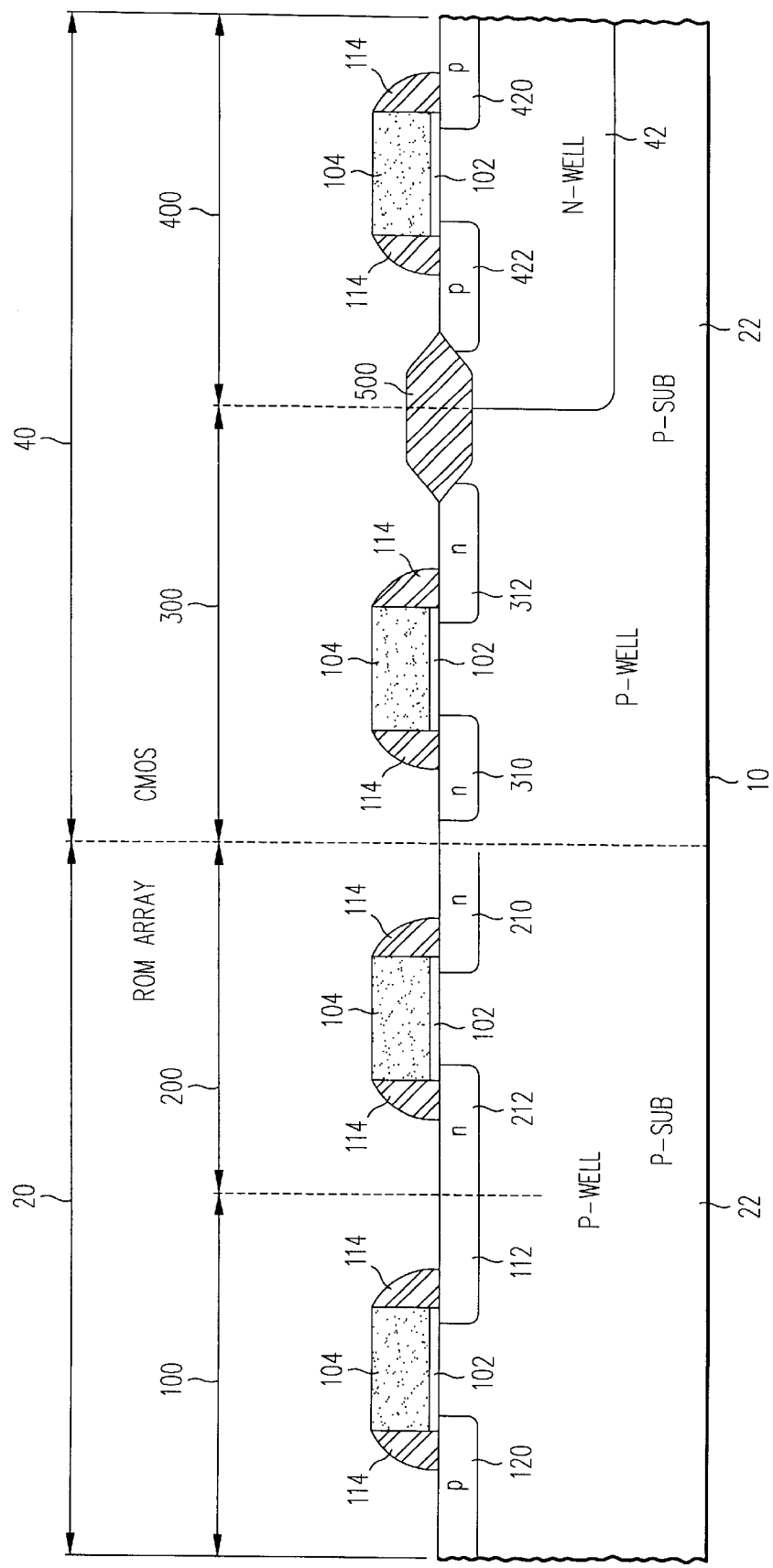
FIG. 3 illustrates a step of side wall spacer deposition of the present invention.

Referring to FIG. 3, an oxide layer is deposited by chemical vapor deposition on the gate structures 104. Side wall spacers 114 are then formed on side walls of the gate structures 104 by anisotropically etching back the oxide layer.

Figure 4:
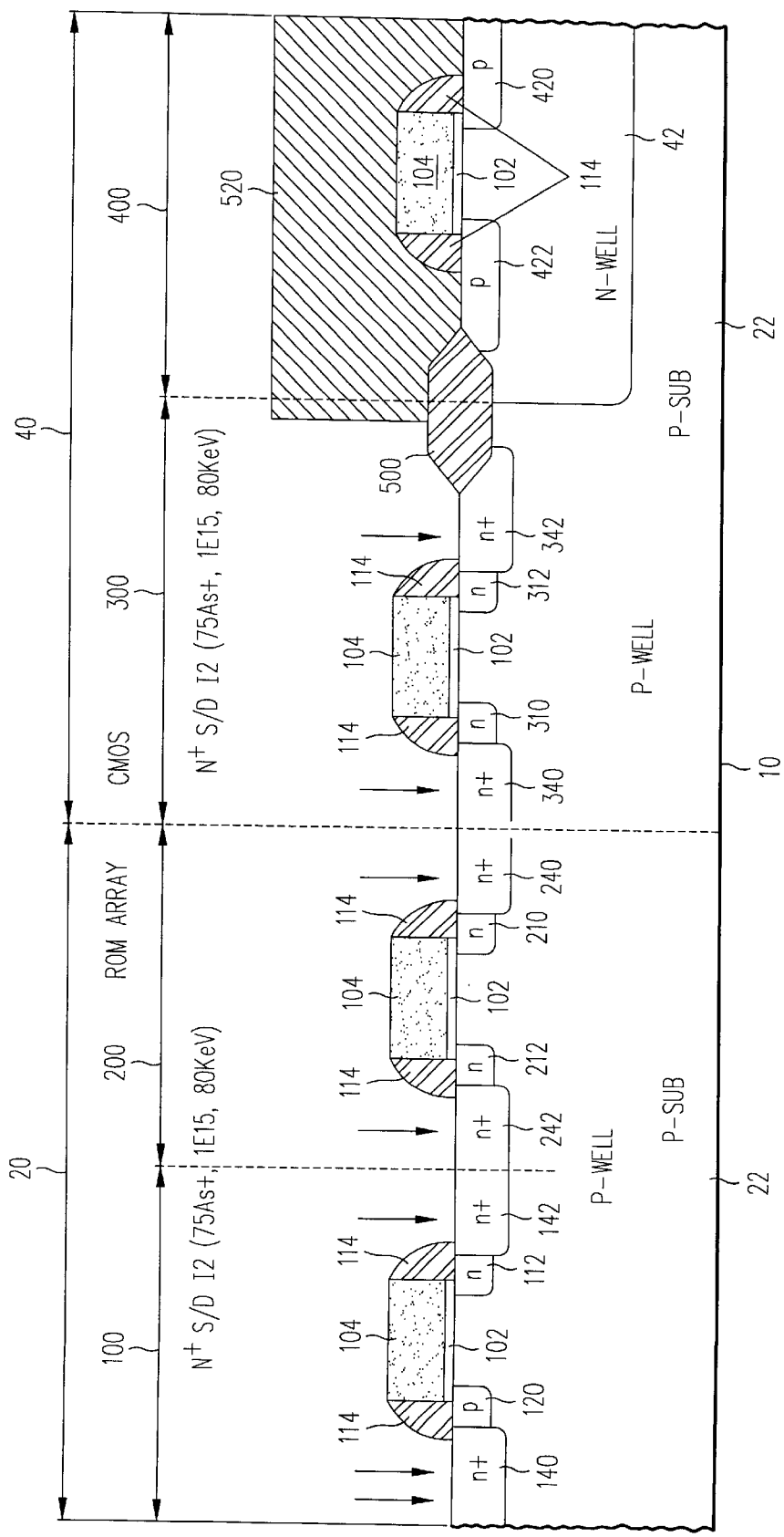
FIG. 4 illustrates a step of N+ S/D ion implantation of the present invention.

Referring to FIG. 4, N+ (high doping level of N-type dopant) S/D (source/drain) ion implantation with N-type conductive dopant is performed on the programmed cell 100, the unprogrammed cell 200, and the NMOS transistor 300 by using the gate structures 104, the side wall spacers 114, and a photoresist 520 as a mask, thereby forming source regions 140, 240, and 340, and drain regions 142, 242, and 342.

The source regions 140, 240, and 340 are located adjacent to the PLDD region 120, the NLDD region 210, and the NLDD region 310, respectively. The drain regions 142, 242, and 342 are located adjacent to the NLDD region 112, 212, and 312, respectively. Each of the source regions 140, 240, and 340 functions as a source of the programmed cell 100, the unprogrammed cell 200, and the NMOS transistor 300, respectively. Each of the drain regions 142, 242, and 342 functions as a drain of the programmed cell 100, the unprogrammed cell 200, and the NMOS transistor 300, respectively.

The dopant of the N+ S/D ion implantation is phosphorus or arsenic, and the implantation is performed with high dosage. The energy, and the dosage of the N+ S/D ion implantation are preferably from about 10 keV to about 100 keV, and from about 1E15 atoms/cm$^2$ to about 1E16 atoms/cm$^2$, respectively. More preferably, the energy, and the dosage of the N+ S/D ion implantation using arsenic (atomic weight: 74.92) as dopant is about 80 keV, and about 3E15 atoms/cm$^2$, respectively.

Figure 5:
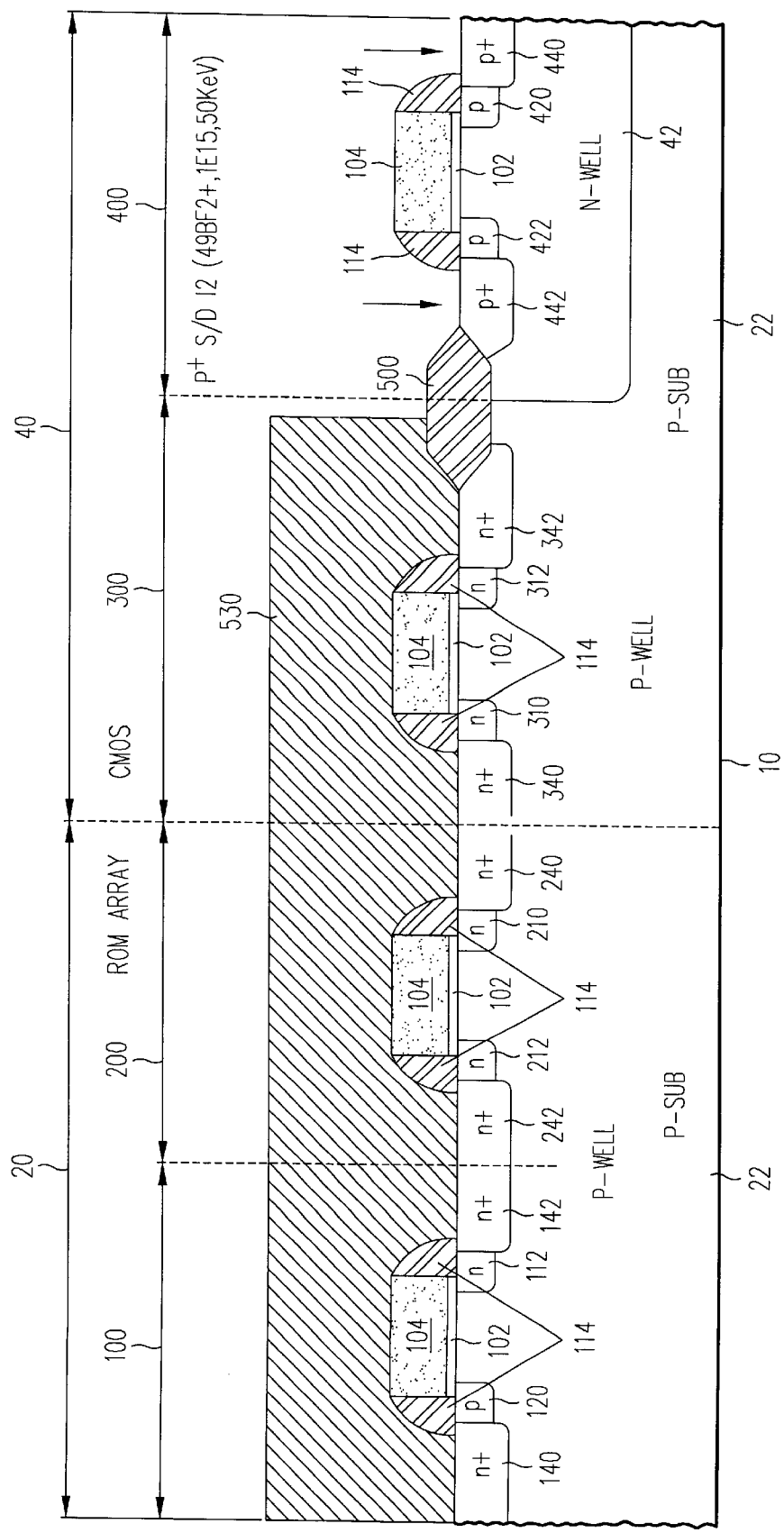
FIG. 5 illustrates a step of P+ S/D ion implantation of the present invention.

Next, referring to FIG. 5, P+ (high doping level of P-type dopant) S/D ion implantation with P-type conductive dopant is performed on the PMOS transistor 400 by using the gate structures 104, the side wall spacers 114, and a photoresist 530 as a mask, thereby forming a source region 440, and a drain region 442.

The source region 440, and the drain region 442 are located adjacent to the PLDD regions 420, and 422, respectively. The source region 440 functions as a source of the PMOS transistor 400. The drain region 442 functions as a drain of PMOS transistor 400.

The dopant of the P+ S/D ion implantation is BF$_2$ or boron, and the implantation is performed with high dosage. The energy, and the dosage of the P+ S/D ion implantation are preferably from about 10 keV to about 100 keV, and from about 1E15 atoms/cm$^2$ to about 1E16 atoms/cm$^2$, respectively. More preferably, the energy, and the dosage of the P+ S/D ion implantation using BF$_2$ as dopant is about 50 keV, and about 3E15 atoms/cm$^2$, respectively.

Then, a high temperature thermal anneal can be performed on the substrate 10 in an ambient containing the gas that is selected from the group of N$_2$, O$_2$, and N$_2$O to activate the dopant, thereby forming shallow junction of the devices. The temperature of the anneal ranges from about 700° C. to about 1100° C.

Figure 6:
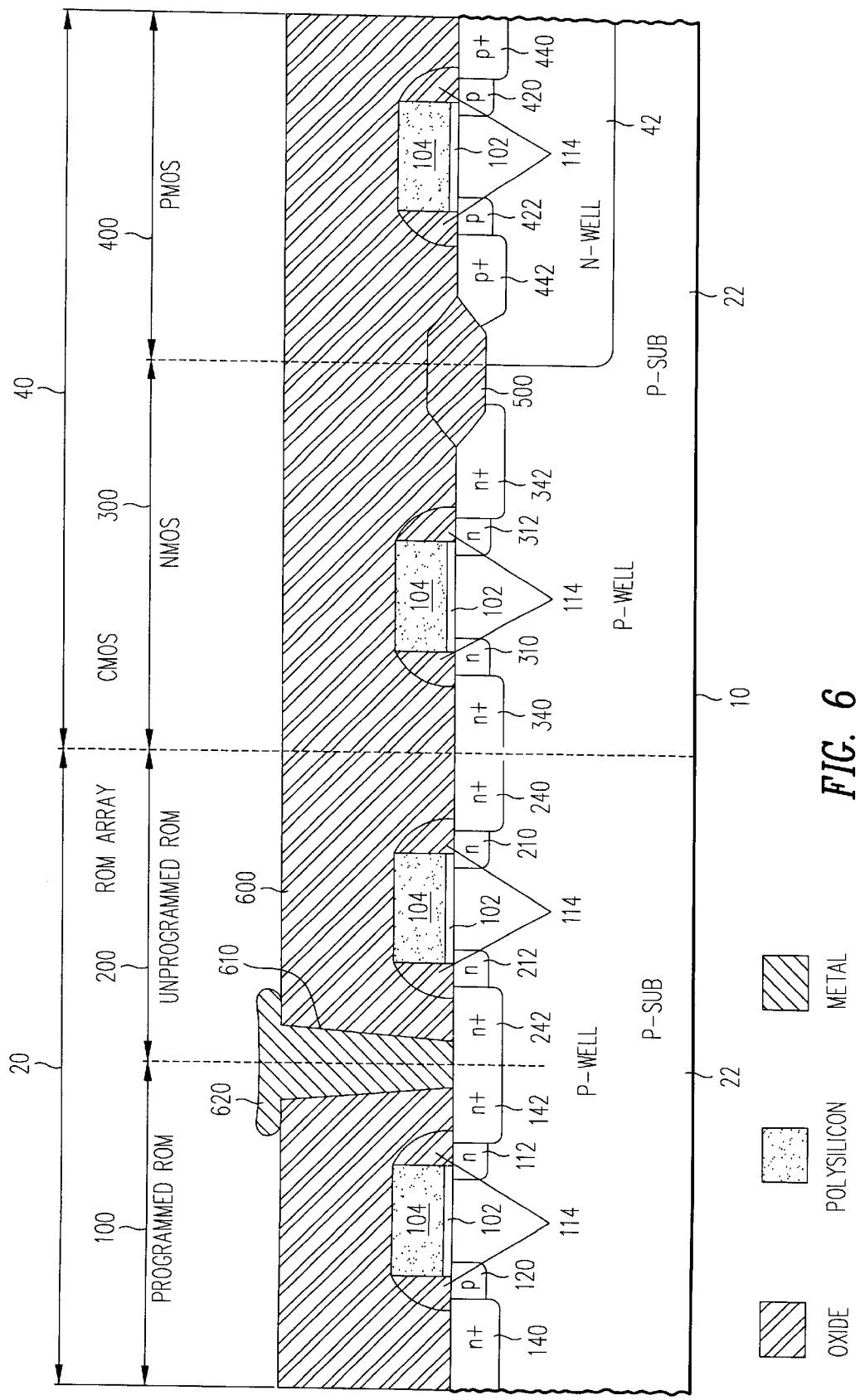
FIG. 6 illustrates a step of forming an N+ contact, and a cross-sectional view of the memory device of the first embodiment of the present invention.

FIG. 6 illustrates a step of forming an N+ contact, and a cross-sectional view of the memory device of the first embodiment of the present invention. Referring to FIG. 6, an insulation layer 600 is deposited on the substrate 10. The insulation layer 600 may be a two-layered composite film including a silicon oxide film, and a BPSG (borophosphorus silicate glass) film. The silicon oxide film, and the BPSG film are deposited by the CVD (chemical vapor deposition) method.

Next, a contact hole 610 is opened at the drain regions 142, and 242 in the insulation layer 600. The contact hole 610 is formed by the anisotropic etching such as the RIE (reactive ion etching) process using the etching mask formed by the photolithography technology.

A metallization structure 620 is deposited to form contacts with the drain regions 142, and 242. The metallization structure 620 may be formed of polysilicon, a refractory metal, a silicide, or a salicide. The metallization structure 620 functions as a drain line of the programmed cell 100, and the unprogrammed cell 200. In other words, the metallization structure 620 receives a power supply voltage, such as 3.3 V, and 5 V, and distributes it to the drain regions 142, and 242. The source regions 140, and 240 are connected to the ground, and set to 0 V.

Figure 7:
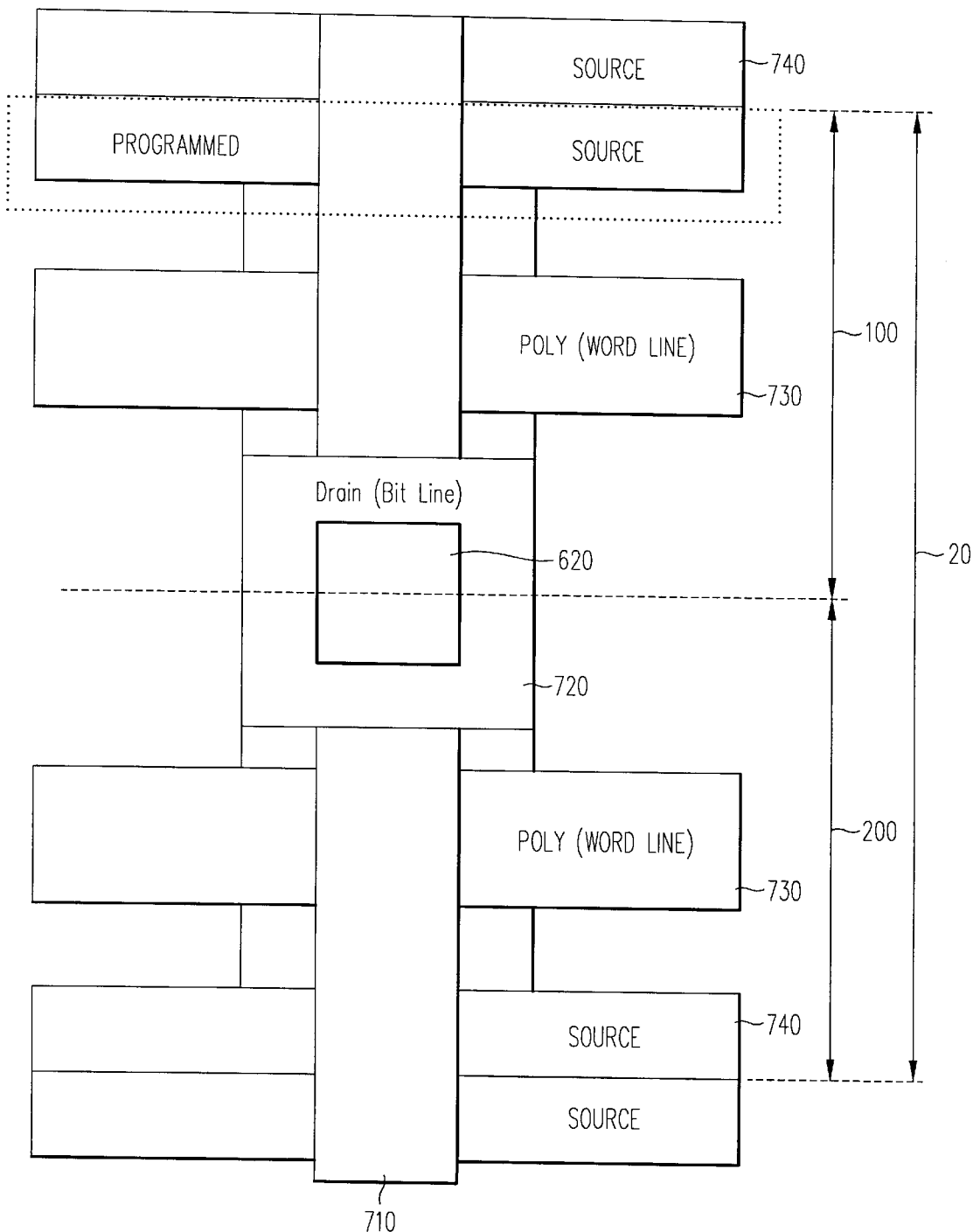
FIG. 7 illustrates a plan view of the memory region of the present invention.

FIG. 7 shows a plan view of the memory region 20 manufactured by the method of the present invention. A bit line 710 connects each drain 720 in the memory region 20 via the metalization structure 620. Word lines 730 formed of polysilicon connect the gate structures 104. Source lines 740 connect the corresponding source regions 140 and 240.

According to the present invention, the photoresist 510 is utilized for both the ROM programming on the memory region 20, and the PLDD forming on the PMOS transistor 400. The photoresists 520, and 530 are used to form source/drain regions in the memory region 20, and the peripheral region 40. Thus, the photoresists 520, and 530 do not need to be modified in accordance with the input data which is to be stored in the memory region 20. Therefore, the present invention requires only a single mask for the ROM programming which is already used in the standard CMOS manufacturing flow, thus reducing manufacturing cost and process time.

Furthermore, the ROM programming step using the photoresist 510 is conducted under the same manufacturing conditions (e.g., implant dose and energy) as those used for PMOS transistor process. Therefore, the present invention requires no additional steps to the current CMOS process, resulting in easy implementation by the existing process facility.

In a first embodiment described hereinbefore, the PLDD region 120 is located between the gate insulation layer 102 and the source region 140, while the NLDD region 112 is located between the gate insulation layer 102 and the drain region 142. More specifically, the source region 140 is adjacent to the PLDD region 120, while the drain region 142 is adjacent to the NLDD region 112. In this specification, this arrangement of the PLDD region 120 and the NLDD region 112 is referred to as a "source-side programming."

The source-side programming according to the present invention exhibits a high threshold voltage (>6 V) and a high breakdown voltage (>6 V), which are advantageous especially for ROM use. A programming technique where a PLDD region, instead of an NLDD region, is located between the gate insulation layer 102 and the drain region 142 in the programmed cell 100 is referred to as a "double-side programming." A second embodiment of the present invention utilizing the double-side programming will be described in detail later, referring to FIGS. 8 and 9.

The source-side programming of the present invention yields a memory device having a breakdown voltage more than 8.0 V (at Ids=1 nA/$\mu$m), and a threshold voltage more than 15.0 V. The conditions of the first embodiment are as follows:

Blanket NLDD ion implantation (31P)
Energy=20 keV, Dosage=6.5E13 atoms/cm$^2$; and
ROM programming PLDD ion implantation (49BF$_2$)
Energy=45 keV, Dosage=1.6E14 atoms/cm$^2$.

Generally, the breakdown characteristics are governed by the channel doping near the drain junction region. In the source-side programming of the present invention, the NLDD region 112 reduces an electric field in the vicinity of the drain region 142, thus avoiding Zener breakdown. Therefore, the device of the first embodiment has a high breakdown voltage. Specifically, the source-side programming according to the present invention achieves a breakdown voltage of about 11.0 V (at Ids=1 $\mu$A), which is comparable to a currently available NMOS device's breakdown voltage.

The source-side programming also achieves a high threshold voltage because the doping profile under the gate edge in the source region 140 is considerably high, and the N+ source region 140 is separated by the spacer oxide, i.e., the side wall spacer 114, which provides the source junction about 0.1 μm outside from the gate edge. As a result of this structure, the resulting channel in the programmed cell 100 according to the present invention requires a high gate voltage to be inverted.

Figure 8:
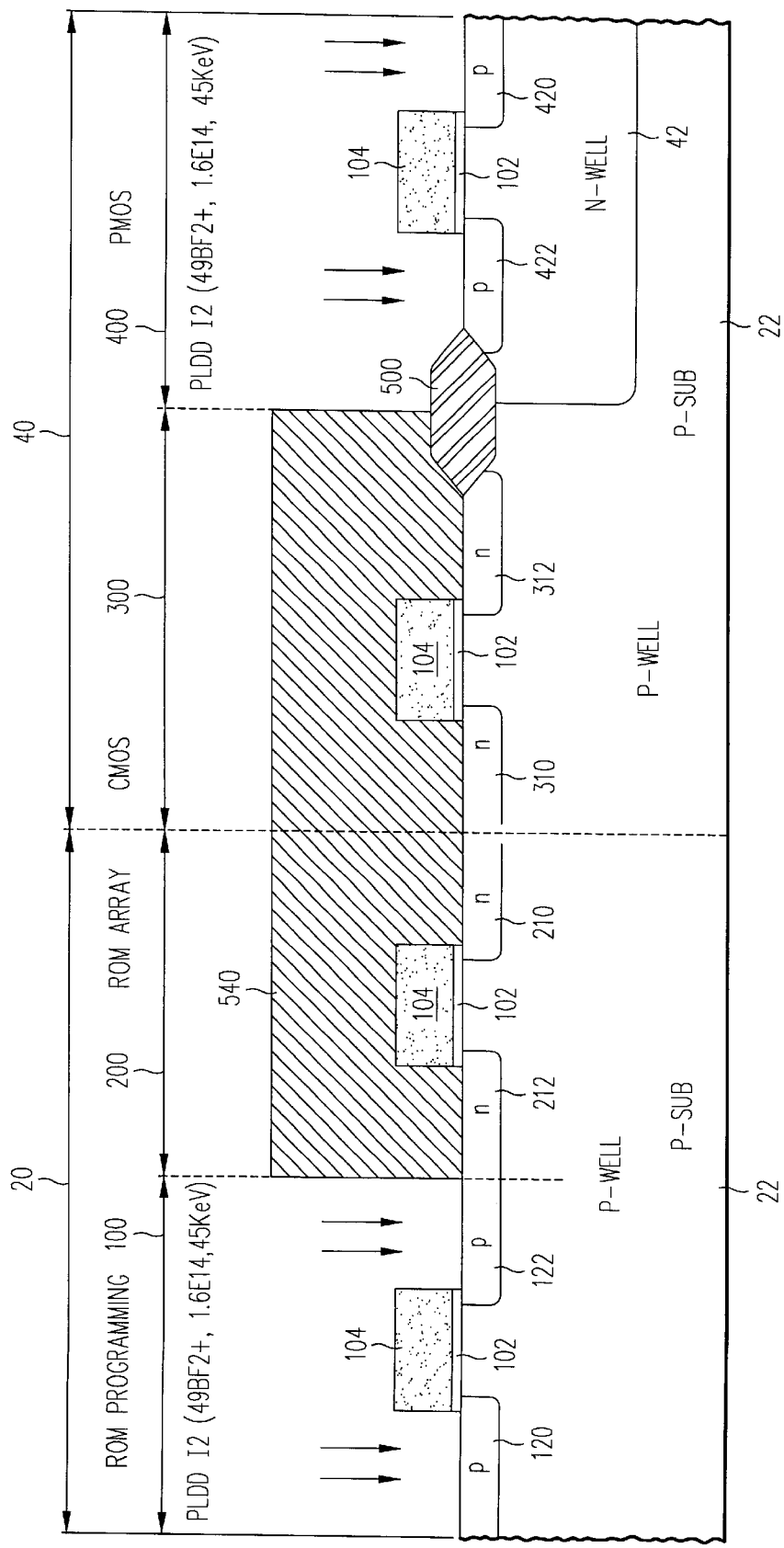
FIG. 8 illustrates a step of PLDD ROM programming ion implantation of the second embodiment of the present invention.

Now, referring to FIGS. 8 and 9, the second embodiment of the present invention will be described. The second embodiment utilizes the step illustrated in FIG. 8 instead of the step shown in FIG. 2. Referring to FIG. 8, a photoresist 540 is patterned to cover the NLDD regions 210, 212, 310, and 312, and to expose the NLDD regions 110, 112, 410, and 412. The photoresist 540 is formed by a conventional lithography process.

Figure 13:
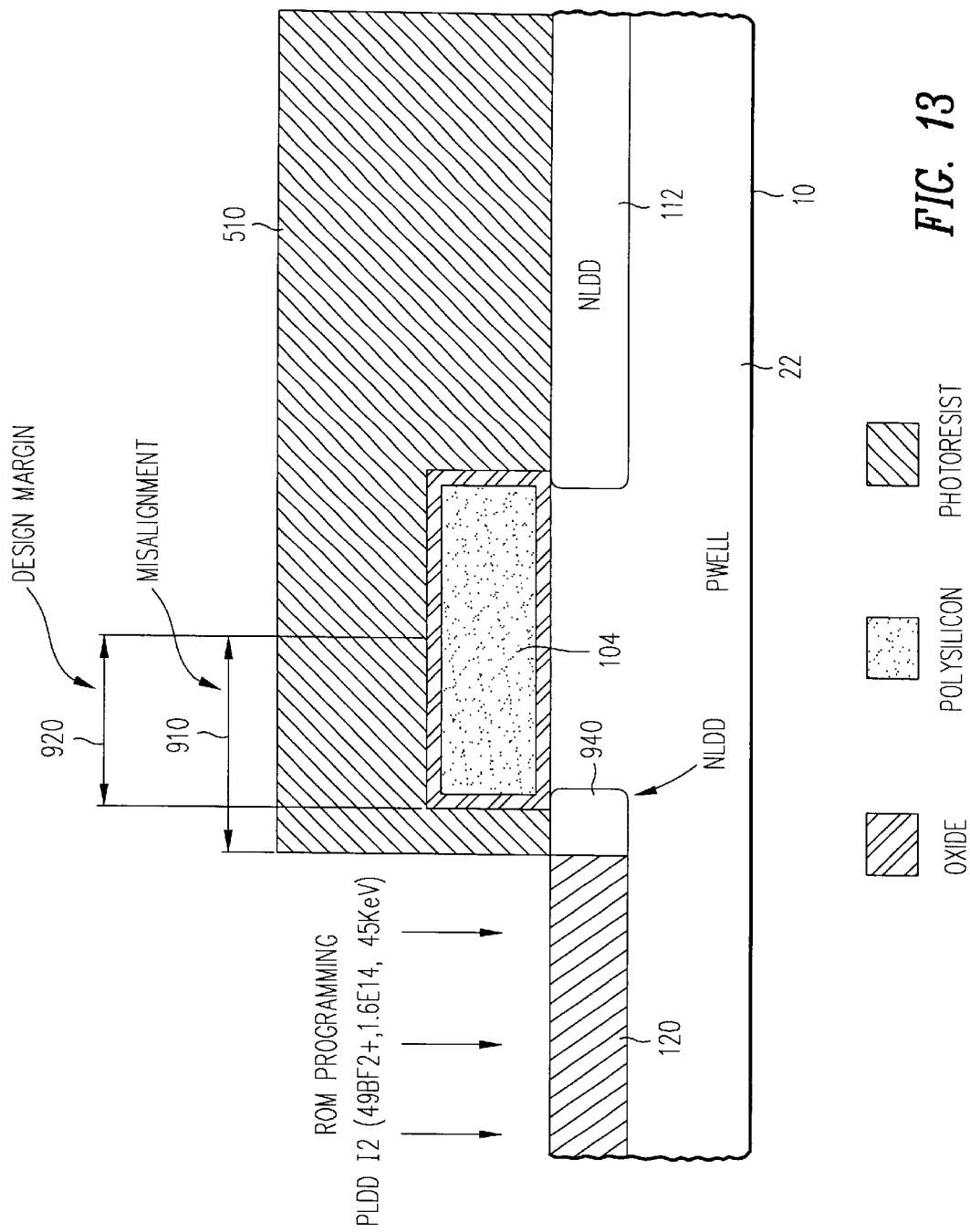
FIG. 13 illustrates Worst Case 2 of PLDD mask misalignment.

ROM programming ion implantation with P-type conductive dopant is performed on the programmed cell 100 and the PMOS transistor 400 by using the photoresist 540 as a mask, thereby forming PLDD regions 120, 122, 420, and 422 adjacent to the gate structures 104. The PLDD regions 120, and 420 are located on a source side of the programmed cell 100, and the PMOS transistor 400, respectively. The PLDD regions 122, and 422 are located on a drain side of the programmed cell 100, and the PMOS transistor 400, respectively. The dopant, the dosage, and the energy of the ROM programming PLDD ion implantation of FIG. 13 is the same as those described referring to FIG. 2.

Figure 9:
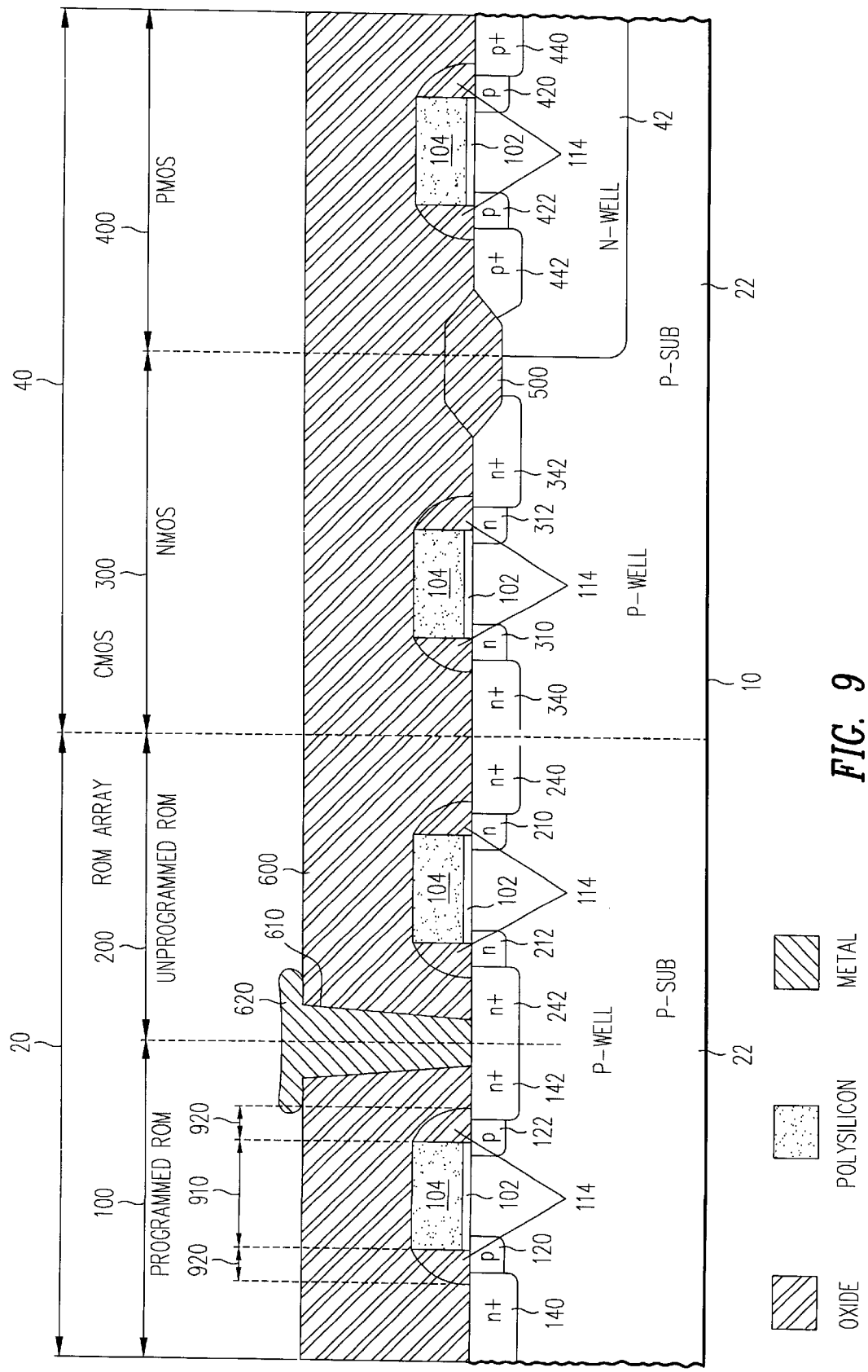
FIG. 9 illustrates a step of forming an N+ contact, and a cross-sectional view of the memory device of the second embodiment of the present invention.

FIG. 9 illustrates a step of forming an N+ contact, and a cross-sectional view of the memory device of the second embodiment of the present invention. The PLDD region 120 is located between the gate insulation layer 102 and the source region 140. The PLDD region 122 is located between the gate insulation layer 102 and the drain region 142. More specifically, the source region 140, and the drain region 142 are adjacent to the PLDD region 120, and the PLDD region 122, respectively. As a result of this double-side programming, the memory device of FIG. 9 exhibits a high threshold voltage, which is advantageous especially for ROM use.

The second embodiment of the present invention can be applied to a device having a gate length less than 0.4 μm because misalignment of the photoresist 540 is not so critical as the first embodiment described referring to FIG. 2. In this specification, the "length" of a gate, or a side wall spacer, is measured along the current path in the device. For example, as those skilled in the art would appreciate, the gate length 910 and the length of the side wall spacer 920 are measured along the horizontal line of FIG. 9.

Now, the advantages of the source-side programming according to the present invention will be described in detail. Conventional ROM programming techniques require the misalignment of the PLDD implant mask to be smaller than half of the polysilicon gate length. Thus, conventional ROM programming shown in, for example, U.S. Pat. No. 5,407,852 cannot be used in a sub-micron (i.e., 0.35 μm or less) process if the total variation of the critical dimension (hereinafter, "CD") and the alignment tolerance is not controlled below half of the gate length (e.g., 0.175 μm in the 0.35 μm process).

Figure 10:
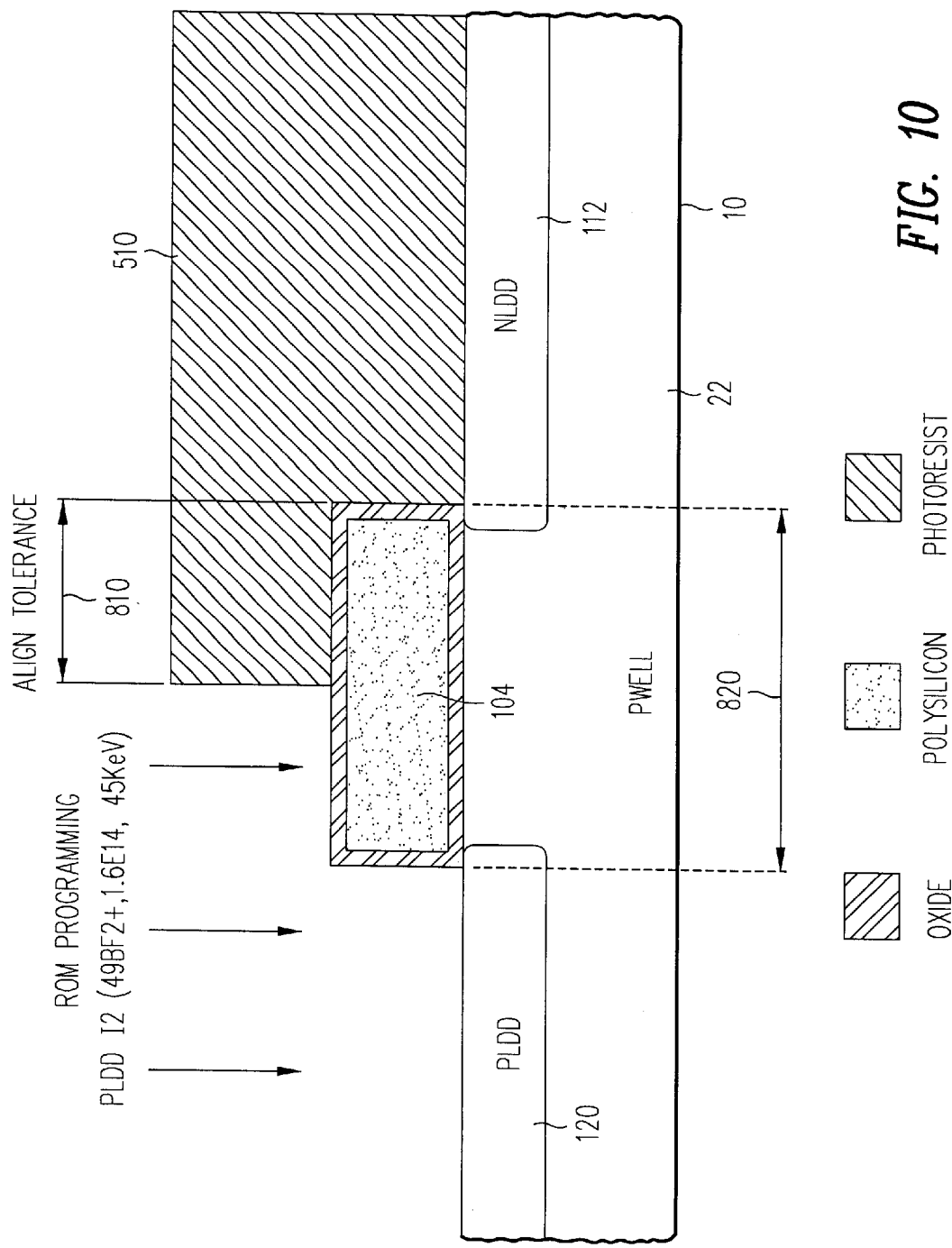
FIG. 10 illustrates an ideal PLDD mask alignment.

FIG. 10 shows the above misalignment requirement. A ROM programming ion implantation with P-type conductive dopant is performed on the substrate 10 having the P-well 22 and the NLDD region 112 by using the photoresist 510 as a mask, thereby forming the PLDD region 120 adjacent to the gate structure 104. An align tolerance 810 is half of a gate length 820.

Figure 11:
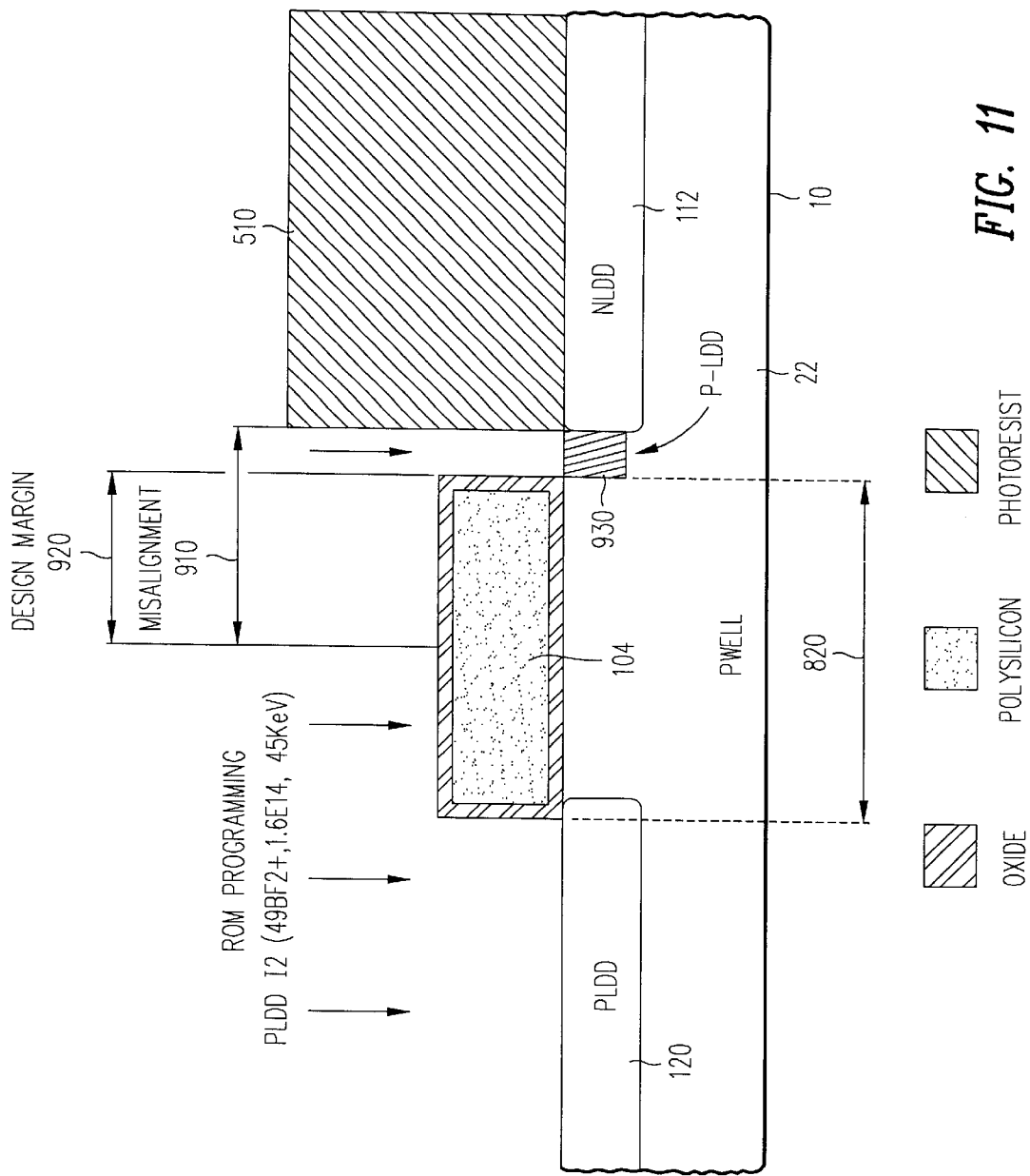
FIG. 11 illustrates Worst Case 1 of PLDD mask misalignment.

However, the source-side programming of the present invention relaxes this misalignment requirement. Referring to FIG. 11, when a misalignment 910 exceeds a predetermined design margin 920 which is half of the gate length 820, an undesired PLDD region 930 is formed between the NLDD region 112 and the gate structure 104.

Figure 12:
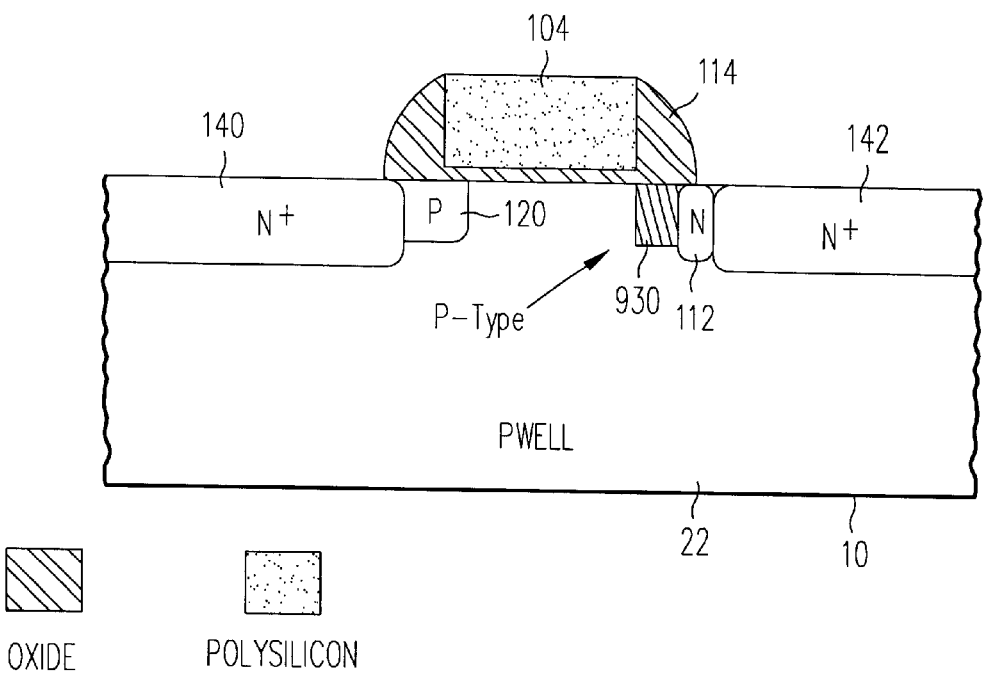
FIG. 12 illustrates a doping profile of Worst Case 1.

FIG. 12 shows the resultant device where the gate structure 104 and the drain region 142 sandwich the undesired PLDD region 930 and the NLDD region 112. Hereinafter, the misalignment shown in FIGS. 11 and 12 is referred to as "Worst Case 1." Even in Worst Case 1, the source-side programming of the present invention does not significantly degrade the ROM device characteristics, such as the breakdown voltage and the threshold voltage, if the process variation (=CD tolerances+Align tolerances) is less than 0.05 μm. Simulation of the case shown in FIG. 12 calculates a breakdown voltage of 7.0 V, which is even larger than a breakdown voltage 4.0 V of a conventional PLDD implant ROM. This simulation result attests the robustness of the process according to the present invention.

TABLE 1 shows margins of 0.35 μm process.

TABLE 1

| DESCRIPTION | VARIATIONS | |
| --- | --- | --- |
| | TYPICAL PROCESS | TIGHTER PROCESS |
| Gate Align Tolerance over Active Area | ±0.15 μm | ±0.14 μm |
| Poly Gate Critical Dimension Tolerance | ±0.05 μm | ±0.05 μm |
| PLDD Mask Align Tolerance over Active Area | ±0.15 μm | ±0.14 μm |
| PLDD Mask Critical Dimension Tolerance | ±0.15 μm | ±0.10 μm |
| Total Variation (RMS) | 0.226 μm | 0.205 μm |
| Applicable Technology (Poly Gate Length) | (0.226 − 0.03*) · 2 = 0.39 μm | (0.205 − 0.03*) · 2 = 0.35 μm |

*Oxide thickness on the poly gate side wall

The source-side programming based on the margins shown in TABLE 1 requires a gate structure to have a gate length of at least 0.39 μm for proper alignment. Thus, the source-side programming of the present invention is especially advantageous when the bit line voltage is larger than 4.0 V and the gate length 820 is more than 0.4 μm. Typical devices for a power supply voltage larger than 4.0 V are more likely to have a gate length of 0.4 μm due to reliability problems such as degradation induced by hot carrier. Therefore, the source-side programming of the present invention can be implemented in various manufacturing situations.

Figure 14:
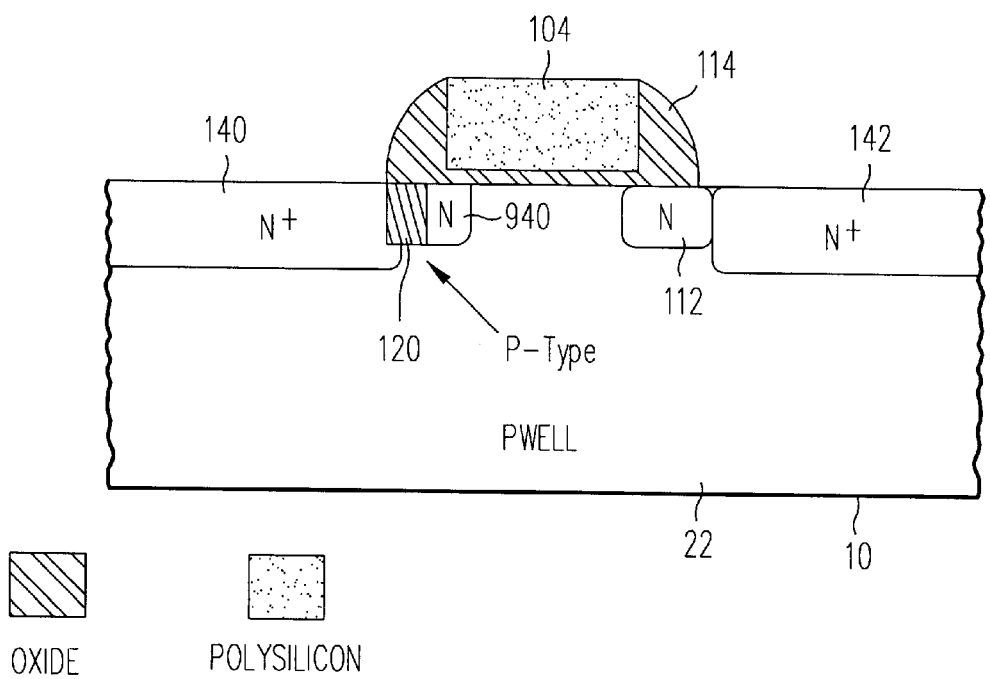
FIG. 14 illustrates a doping profile of Worst Case 2.

Now referring to FIGS. 13 and 14, based on the process margin analysis shown in TABLE 1, another worst case of mask misalignment (hereinafter, "Worst Case 2") will be discussed now. In FIGS. 13 and 14, the photoresist 510 is misaligned to cover excessively over the NLDD region 110 on the source side, thus forming an undesired NLDD region 940. As a result, the undesired NLDD 940 is located between the PLDD 120 and the gate structure 104.

TABLE 2 shows threshold voltage and breakdown voltage of devices manufactured by the source-side programming and the double-side programming according to the present invention.

TABLE 2

| DEVICE CHARACTERISTICS | SPEC. | DOUBLE-SIDE ROM | SOURCE-SIDE ROM | | |
|---|---|---|---|---|---|
| | | | IDEAL CASE | WORST CASE 1 | WORST CASE 2 |
| Threshold Voltage (V) | >5.5 V @ Ids = 1.0 μA | >9.0 V | >15.0 V | >15.0 V | >15.0 V |
| Breakdown Voltage (V) | >5.5 V @ Ids = 1.0 nA/μm | 4.0 V | 8.4 V | 7.0 V | 7.5 V |

As indicated in TABLE 2, the source-side programming of the present invention achieves excellent ROM device characteristics in both of Worst Cases 1 and 2. According to the simulation, as long as the process variation (=CD tolerances+Align tolerances) is smaller than the length of ((CD of gate length)/2+(length of the side wall spacer)/2), which is 0.25 μm for a 0.35 μm transistor, the present invention satisfies the required ROM device specification for bit line voltage more than 4.0 V.

The first embodiment of the present invention, which performs the source-side programming, exhibits robust process for the sub-micron process even in Worst Cases 1, and 2, as shown in TABLE 2. Specifically, even in those worst cases, the breakdown voltage of the device is 7.0 V (Worst Case 1) or 7.5 V (Worst Case 2), which is sufficiently larger than the power supply voltage of 5 V.

In a case with a bit line voltage less than 4.0 V, the ROM programming process does not require the photoresist 510 to cover the gate structure 104. In other words, the ROM programming can be performed by either the source-side programming or the double-side programming. Therefore, the process margin problems will not arise.

While the present invention is described in illustrative embodiments where a P-type silicon semiconductor substrate is utilized, it should be appreciated that an N-type substrate can be used as the substrate 10 by switching conductivity types (P-type and N-type) in the above-described method and apparatus of the present invention. In other words, the memory region 20 can include PMOS transistors as the programmed cell 100 and the unprogrammed cell 200. Such a PMOS ROM device having the PMOS transistors in the memory region 20 is manufactured by utilizing blanket ion implantation with P-type conductive dopant corresponding to the process of FIG. 1, and ROM programming ion implantation with N-type conductive dopant corresponding to the process of FIG. 2.

In FIGS. 1–6, and 8–9, the memory region 20 includes a pair of a programmed cell and an unprogrammed cell, and the peripheral region 40 includes a pair of an NMOS transistor and a PMOS transistor. However, it should be appreciated that each of the memory region 20 and the peripheral region 40 can include cells or transistors more than two.

Those skilled in the art would appreciate that an additional step can be added to the above-described method of the present invention, such as a wafer preparation step, an electrical testing step, and an assembly step.

It should be appreciated that additional circuitry or devices can be integrated in the memory region 20 and/or the peripheral region 40. Alternatively, the device of the present invention can be integrated into a larger-scale semiconductor device, such as a microprocessor, a digital signal processor, a co-processor, and an analog-digital converter.

In addition, the invention is described primarily in the context of its use in a ROM device. However, the present invention has utility for manufacturing devices other than a ROM device.

It is to be understood that while the invention has been described above in conjunction with preferred specific embodiments, the description and examples are intended to illustrate and not limit the scope of the invention, which is defined by the scope of the appended claims.

What is claimed is:

1. A method for manufacturing a semiconductor device on a semiconductor substrate including a memory region having programmed cells and unprogrammed cells, and a peripheral region having transistors of a first conductivity type, and transistors of second conductivity type opposite to said first conductivity type, said method comprising the steps of:

forming a gate insulation layer on said semiconductor substrate;

forming gate structures on said gate insulation layer;

performing a first ion implantation of said first conductivity type to form LDD structures of said first conductivity type in said memory region and said peripheral region;

forming a mask which covers said unprogrammed cells, and said transistors of said first conductivity type, and exposes a part of said programmed cells;

performing a second ion implantation of said second conductivity type by using said mask to form LDD structures of said second conductivity type in said transistors of said second conductivity type, and said part of said programmed cells;

forming spacers on side walls of said gate structures;

performing a third ion implantation of said first conductivity type by using said gate structures and said spacers to form source regions and drain regions in said programmed cells, said unprogrammed cells, and said transistors of said first conductivity type; and performing a fourth ion implantation of said second conductivity type to form source regions and drain regions in said transistors of said second conductivity.

2. The method of claim 1, wherein said first conductivity type is N-type, and said second conductivity type is P-type.

3. The method of claim 2, wherein said mask covers said drain regions in said programmed cells, and exposes said source regions in said programmed cells, thereby providing said LDD structures of said first conductivity type adjacent to said drain regions, and providing said LDD structures of said second conductivity type adjacent to said source regions.

4. The method of claim 2, wherein said mask exposes said drain regions in said programmed cells, thereby allowing said drain regions in said programmed cells to have LDD structures of said second conductivity.

5. The method of claim 1, wherein a dopant of said first ion implantation is selected from a group consisting of phosphorus and arsenic.

6. The method of claim 1, wherein a dopant of said second ion implantation is selected from a group consisting of $BF_2$ and boron.

7. The method of claim 1, wherein an energy of said first implantation ranges from about 10 keV to about 100 keV.

8. The method of claim 1, wherein an energy of said second implantation ranges from about 10 keV to about 120 keV.

9. The method of claim 1, wherein a dosage of said first ion implantation ranges from about 1E12 atoms/cm$^2$ to about 2E14 atoms/cm$^2$.

10. The method of claim 1, wherein a dosage of said second ion implantation ranges from about 5E12 atoms/cm$^2$ to about 5E14 atoms/cm$^2$.

11. A method for manufacturing a semiconductor device, said method comprising the steps of:
   forming a semiconductor substrate including a well of a first conductivity type and having a memory region and a peripheral region;
   forming a gate insulation layer on said well;
   forming gate structures on said gate insulation layer;
   forming source regions of a second conductivity type in said memory and peripheral regions, said second conductivity type being opposite to said first conductivity type;
   forming drain regions of said second conductivity type in said memory and peripheral regions;
   performing a first ion implantation of said first conductivity type to form LDD structures of said first conductivity type in said memory region and said peripheral region;
   forming a mask which exposes at least one of said source regions, and covers remaining source regions other than said one of said source regions; and
   performing a second ion implantation of said second conductivity type by using said mask to form a first LDD region of said first conductivity type located between said gate insulation layer and said source region; and to form a second LDD region of said second conductivity type located between said gate insulation layer and said drain region, wherein said first and second LDD regions are adjacent the same gate insulation layer of the same gate structure.

12. The method of claim 11, wherein said first conductivity type is P-type, and said second conductivity type is N-type.

13. A method for manufacturing a semiconductor device, comprising the acts of:
   providing a semiconductor substrate, the substrate having a memory region and a peripheral region;
   forming electrically conductive gate structures over the memory and peripheral regions;
   forming source regions and drain regions in the memory region and peripheral region, the source and drain regions being a first conductivity type;
   forming a mask, wherein the mask:
      exposes at least a portion of a first source region and covers at least a portion of a first drain region, the first source and drain regions being in the memory region and adjacent a first gate structure;
      covers a second source region and a second drain region, the second source and drain regions being in the memory region and adjacent a second gate structure;
      exposes at least a portion of a third source region and at least a portion of a third drain region, the third source and drain regions being in the peripheral region and adjacent a third gate structure; and
      covers a fourth source region and a fourth drain region, the fourth source and drain regions being in the peripheral region and adjacent a fourth gate structure; and
   performing an ion implantation through the mask to form LDD regions of a second conductivity type in at least a portion of the first source region, at least a portion of the third source region, and at least a portion of the third drain region, the second conductivity type being opposite the first conductivity type.

14. The method of claim 13 wherein the first conductivity type is N-type and the second conductivity type is P-type.

15. A method for manufacturing a semiconductor device, comprising the acts of:
   providing a semiconductor substrate, the substrate having a memory region and a peripheral region;
   forming electrically conductive gate structures over the memory and peripheral regions;
   forming source regions and drain regions in the memory region and peripheral region, the source and drain regions being a first conductivity type;
   forming a mask, wherein the mask:
      exposes at least a portion of a first source region and at least a portion of a first drain region, the first source and drain regions being in the memory region and adjacent a first gate structure;
      covers a second source region and a second drain region, the second source and drain regions being in the memory region and adjacent a second gate structure;
      exposes at least a portion of a third source region and at least a portion of a third drain region, the third source and drain regions being in the peripheral region and adjacent a third gate structure; and
      covers a fourth source region and a fourth drain region, the fourth source and drain regions being in the peripheral region and adjacent a fourth gate structure; and
   performing an ion implantation through the mask to form LDD regions of a second conductivity type in at least a portion of the first source region, at least a portion of the first drain region, at least a portion of the third source region, and at least a portion of the third drain region, the second conductivity type being opposite the first conductivity type.

16. The method of claim 15 wherein the first conductivity type is N-type and the second conductivity type is P-type.

* * * * *